United States Patent
Kumagai et al.

(10) Patent No.: US 7,906,848 B2
(45) Date of Patent: Mar. 15, 2011

(54) SEMICONDUCTOR DEVICE

(75) Inventors: Yukihiro Kumagai, Hitachinaka (JP); Hiroyuki Ohta, Tsuchiura (JP); Naotaka Tanaka, Kasumigaura (JP); Masahiko Fujisawa, Takarazuka (JP); Akihiko Ohsaki, Itami (JP)

(73) Assignee: Renesas Electronics Corporation, Kawasaki (JP)

( * ) Notice: Subject to any disclaimer, the term of this patent is extended or adjusted under 35 U.S.C. 154(b) by 0 days.

(21) Appl. No.: 12/389,071

(22) Filed: Feb. 19, 2009

(65) Prior Publication Data

US 2009/0212437 A1    Aug. 27, 2009

(30) Foreign Application Priority Data

Feb. 27, 2008   (JP) ................. 2008-045666

(51) Int. Cl.
*H01L 21/31*   (2006.01)
*H01L 21/469*  (2006.01)

(52) U.S. Cl. ........ 257/758; 257/620; 257/774; 438/623; 438/637

(58) Field of Classification Search .................. 257/620, 257/774, 758, E23.001
See application file for complete search history.

(56) References Cited

U.S. PATENT DOCUMENTS

| | | | |
|---|---|---|---|
| 7,141,882 B2 * | 11/2006 | Watanabe | 257/758 |
| 7,635,907 B2 * | 12/2009 | Ueda | 257/529 |
| 2005/0087872 A1 | 4/2005 | Abe | |
| 2005/0093169 A1 * | 5/2005 | Kajita | 257/774 |
| 2006/0055005 A1 | 3/2006 | Furusawa et al. | |

FOREIGN PATENT DOCUMENTS

| | | |
|---|---|---|
| JP | 2005-129961 A | 5/2005 |
| JP | 2005-136003 A | 5/2005 |
| JP | 2006-80369 | 3/2006 |
| JP | 2006-147653 A | 6/2006 |
| JP | 2006-318988 | 11/2006 |

* cited by examiner

*Primary Examiner* — Phuc T Dang
(74) *Attorney, Agent, or Firm* — Mattingly & Malur, P.C.

(57) ABSTRACT

In a semiconductor device having a Low-k film as an interlayer insulator, peeling of the interlayer insulator in a thermal cycle test is prevented, thereby providing a highly reliable semiconductor device. In a semiconductor device having a structure in which interlayer insulators in which buried wires each having a main electric conductive layer made of copper are formed and cap insulators of the buried wires are stacked, the cap insulator having a relatively high Young's modulus and contacting by its upper surface with the interlayer insulator made of a Low-k film having a relatively low Young's modulus is formed so as not to be provided in an edge portion of the semiconductor device.

16 Claims, 14 Drawing Sheets

SEMICONDUCTOR DEVICE

CROSS-REFERENCE TO RELATED APPLICATION

The present application claims priority from Japanese Patent Application No. JP 2008-045666 filed on Feb. 27, 2008, the content of which is hereby incorporated by reference into this application.

TECHNICAL FIELD OF THE INVENTION

The present invention relates to a semiconductor device. More particularly, the present invention relates to a technique effectively applied to a resin-sealed semiconductor device using a low dielectric constant film (Low-k film) as an insulator between wiring layers.

BACKGROUND OF THE INVENTION

In recent years, with the scaling down of transistors for achieving higher integration and higher speed in LSI applications, a problem arising from signal delay of a wire has become more pronounced. As a solution, reductions in wire resistance and also capacitance between wires have been desired. Accordingly, for the purpose of reducing the capacitance between wires, a wiring layer formation technique using a low dielectric constant material having a lower dielectric constant than a silicon oxide film deposited by a conventional plasma CVD method and the like for an interlayer insulator material has been developed. Also, for the reduction of the wire resistance, a Cu wiring technique using Cu (copper) having a lower resistance than Al (aluminum) for a wire material has been developed.

On the other hand, in a semiconductor device (semiconductor chip) using the low dielectric constant film having a low dielectric constant (hereinafter, referred to as Low-k film), there is a problem that peeling occurs at an interface between the Low-k film and an underlying cap film in a chip corner portion of the semiconductor device in a process of resin-sealing the semiconductor device. In Japanese Patent Application Laid-Open Publication No. 2006-318988 (Patent Document 1) and Japanese Patent Application Laid-Open Publication No. 2006-80369 (Patent Document 2), methods for preventing such peeling are disclosed.

Japanese Patent Application Laid-Open Publication No. 2006-318988 (Patent Document 1) discloses a technique in which the peeling of the interlayer insulator from the chip corner, which is caused when the semiconductor chip is resin-sealed, is prevented by etching and removing the multi-layer interlayer insulators formed in the chip corner and then providing a resin-protection film therein.

Japanese Patent Application Laid-Open Publication No. 2006-80369 (Patent Document 2) discloses a technique in which a sacrificial pattern is provided outside a guard ring in the chip corner portion, thereby preventing the peeling of the interlayer insulator from the chip corner to progress inside the guard ring by the sacrificial pattern in a thermal cycle test after resin-sealing the semiconductor device.

SUMMARY OF THE INVENTION

However, the technique disclosed in the Japanese Patent Application Laid-Open Publication No. 2006-318988 (Patent Document 1) includes such an issue that the depth in a trench process for performing the etching process to recent multi-layer interlayer insulators having as many as 10 layers is increased, and productivity is thereby deteriorated.

Also, the technique disclosed in the Japanese Patent Application Laid-Open Publication No. 2006-80369 (Patent Document 2) can stop the progress of the peeling of the interlayer insulator, but it does not consider an issue of preventing the occurrence of the peeling itself.

An object of the present invention is to provide a technique capable of preventing the peeling of an interlayer insulator from a chip corner in a semiconductor device using a Low-k film as an interlayer insulator.

The above and other objects and novel characteristics of the present invention will be apparent from the description of this specification and the accompanying drawings.

The typical ones of the inventions disclosed in this application will be briefly described as follows.

(1) A semiconductor device according to the present invention is a semiconductor device having a semiconductor chip of a planar rectangular shape, and the semiconductor chip includes:

a semiconductor substrate having a semiconductor element formed on its main surface and patterned into the planer rectangular shape;

a first insulator formed on the main surface of the semiconductor substrate;

a first wire formed by filling an electric conductive film in a first trench portion formed in the first insulator;

a second insulator formed on the first insulator and the first wire; and a third insulator formed on the second insulator so as to contact the second insulator, wherein the second insulator has a higher Young's modulus compared to the third insulator, and the second insulator is removed in a first region corresponding to a planer outer periphery of the semiconductor chip.

(2) Also, a semiconductor device according to the present invention is a semiconductor device having a semiconductor chip of a planer rectangular shape, and the semiconductor chip includes:

a semiconductor substrate having a semiconductor element formed on its main surface and patterned into the planer rectangular shape;

a first insulator formed on the main surface of the semiconductor substrate;

a first wire formed by filling an electric conductive film in a first trench portion formed in the first insulator;

a second insulator formed on the first insulator and the first wire; and a third insulator formed on the second insulator so as to contact the second insulator, wherein the third insulator has a lower degree of adhesion to an upper-layer film or a lower-layer film compared to the second insulator, and the second insulator is removed in a first region corresponding to a planar outer periphery of the semiconductor chip.

The effects obtained by typical aspects of the present invention will be briefly described below.

By reducing a difference in Young's modulus at an interface of an interlayer insulator in an edge portion of a semiconductor device (chip), a stress acting to the interlayer insulator in the chip corner in the thermal cycle test can be reduced, and thus, occurrence of the peeling of the interlayer insulator can be prevented.

BRIEF DESCRIPTIONS OF THE DRAWINGS

DESCRIPTIONS OF THE PREFERRED EMBODIMENTS

Figure 1:
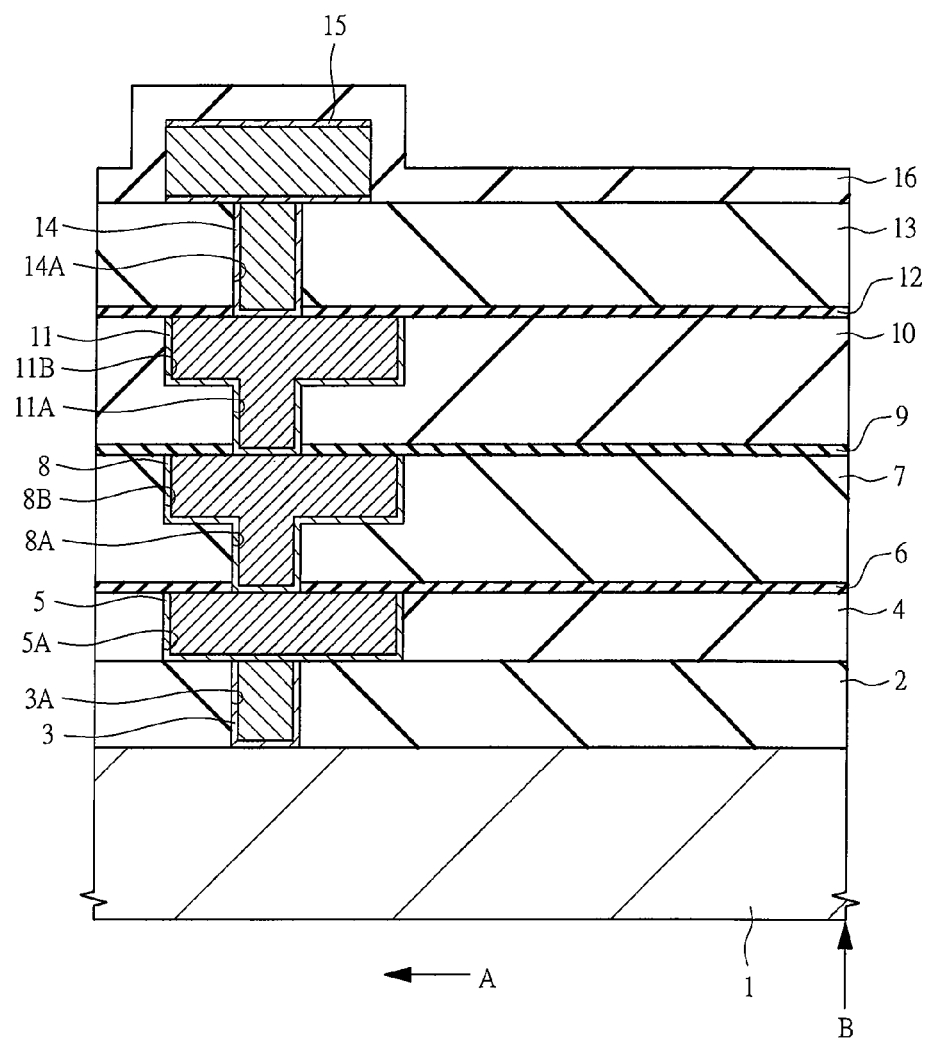
FIG. 1 is a cross section diagram of a principal part of a semiconductor device having a multi-layer wiring structure formed by using a Low-k film as an interlayer insulator, which the inventors have studied.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle. In addition, regarding the components and the like in the embodiment examples, when described as "formed from A" and "formed of A", it is needless to say that other components are not removed unless otherwise stated as the only component in particular.

Similarly, in the embodiments described below, when the shape of the components, positional relation thereof, and the like are mentioned, the substantially approximate and similar shapes and the like are included therein unless otherwise stated or except the case where it can be conceived that they are apparently excluded in principle. The same goes for the numerical value and the range described above.

Still further, when the materials and the like are described, the specified material is a main material unless otherwise stated in particular or except the case where it is not in principle or in state, and the secondary components, additives, additional components and the like are not removed. For example, a silicon material includes not only the case of pure silicon but also secondary and ternary alloys (for example, SiGe) and the like formed of additive impurities and silicon as the main component unless otherwise stated.

Also, components having the same function are denoted by the same reference symbols throughout the drawings for describing the embodiments, and the repetitive description thereof is omitted.

Also, in some drawings used in the embodiments, hatching is used even in a plan view so as to make the drawings easy to see.

The present inventors have uncovered a generating mechanism of the peeling, which occurs when a thermal cycle test is performed on the resin-sealed semiconductor device using the Low-k film at an interface of the Low-k film, by stress analysis. First, the generating mechanism thereof will be described. Note that the Low-k film is an insulator having a relatively lower dielectric constant than a silicon oxide film deposited by plasma CVD method and the like, and includes, for example, a SiOC film, an organic polymer-based film, a porous film similar to them and others.

FIG. 1 is one example of a cross section of the semiconductor device having the multi-layer wiring structure formed by using the Low-k film as the interlayer insulator. In FIG. 1, an arrow A indicates an inward direction of the semiconductor device. A circuit formation region where a wire and a semiconductor element are formed is formed on a side indicated by the arrow A. Also, an arrow B indicates an edge portion of the semiconductor device. The semiconductor device mentioned here is a semiconductor chip (hereinafter, simply referred to as a chip). That is, the arrow B indicates the edge portion of the chip.

As shown in FIG. 1, interlayer insulators 2 and 4 such as a TEOS (Tetra-Ethyl-Ortho-Silicate) film are formed on a semiconductor substrate 1 made of single crystal silicon or the like, and a via 3 and a buried wire 5 are formed therein.

The via 3 is formed by, for example, forming a thin barrier electric conductive film inside a via hole 3A formed in the interlayer insulator 2, and then filling an electric conductive film such as tungsten in the via hole. The buried wire 5 is formed by forming a thin barrier electric conductive film inside a trench 5A for the buried wire formation formed in the interlayer insulator 4, and then filling an electric conductive film such as a copper film or a copper alloy film in the trench. A cap insulator 6 for preventing a diffusion of the copper into the interlayer insulator is formed on a whole upper surface of the buried wire 5 made of copper, and an interlayer insulator 7 made of a Low-k film is formed on an upper surface of the cap insulator 6. A buried wire 8 having a main electric conductive layer made of copper or copper alloy is formed in the cap insulator 6 and the interlayer insulator 7. The buried wire 8 is formed by a so-called damascene process of filling a contact hole 8A and a trench 8B formed in the cap insulator 6 and the interlayer insulator 7 with an electric conductive film made of copper or copper alloy at once, and then removing the electric conductive film outside the trench 8B by a CMP (Chemical Mechanical Polishing) method or the like. On an upper surface of the buried wire 8, cap insulators 9 and 12 similar to the cap insulator 6, an interlayer insulator 10 made of a Low-k film similar to the interlayer insulator 7, and a buried wire 11 (including a contact hole 11A and a trench 11B) having the main electric conductive layer made of copper or copper alloy similar to the buried wire 8 (including the contact hole 8A and the trench 8B) are provided. On an upper surface of these wiring layers, an interlayer insulator 13 such as a TEOS film is formed again, and a via hole 14A and a via 14 similar to the via hole 3A and the via 3 are formed in the interlayer insulator 13. Through the via 14 as described above, a wire 15 having a main electric conductive layer made of aluminum in the uppermost layer and a surface protection film 16 for preventing the intrusion of moisture from a surface are formed. The surface protection film 16 is formed from a silicon oxide film or a stacked film of a silicon oxide film and a silicon nitride film. In the semiconductor device shown in FIG. 1, cap insulators 6, 9, and 12 of copper wiring layers are exposed at the edge portion B.

Figure 2:
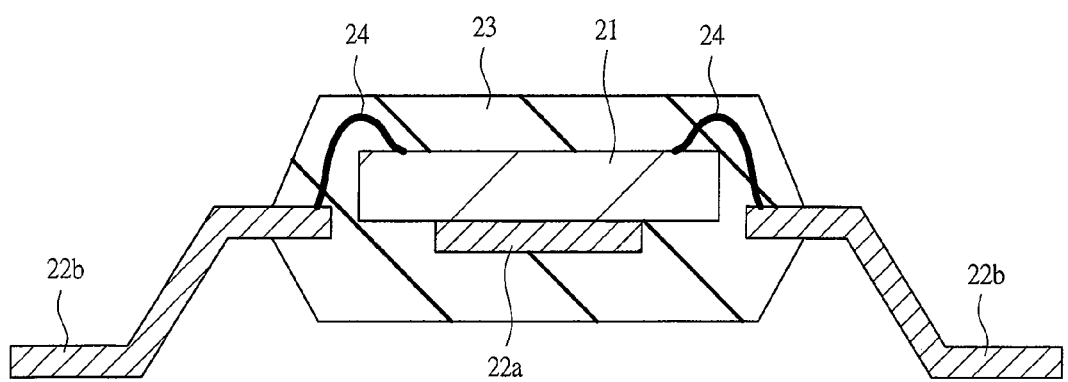
FIG. 2 is a cross section diagram of a principal part for describing a package form of the semiconductor device, which the inventors have studied.

The semiconductor device is sealed with resin into a desired package form. One example (cross section) of the resin-sealed package is shown in FIG. 2. As shown in FIG. 2, a semiconductor device (semiconductor chip) 21 provided on a metal frame 22a is electrically connected to a metal frame 22b by metal wires 24 and is sealed with resin 23.

Figure 3:
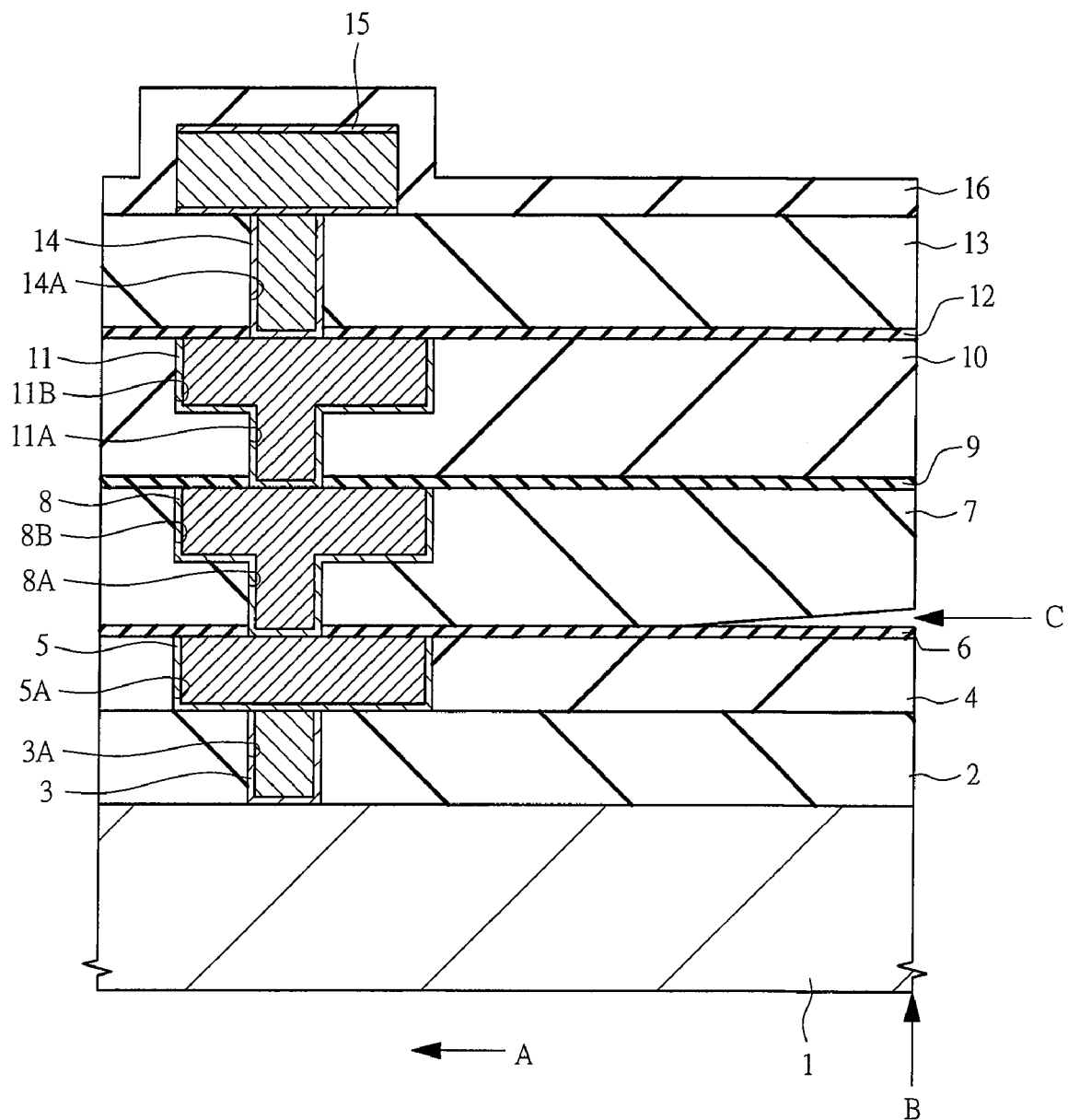
FIG. 3 is a cross section diagram of a principal part for describing an occurrence position of a shear stress in the semiconductor device, which the inventors have studied.

And then, the thermal cycle test is performed as one of inspection processes after packaging. In the thermal cycle test, the temperature is changed from, for example, about 150° C. to about −65° C. At this time, as shown in FIG. 3, there arises a problem that the peeling occurs at an interface between a lowermost surface of the Low-k film and the cap insulator (interface between the interlayer insulator 7 and the cap insulator 6, a portion shown by an arrow C in FIG. 3) in a chip edge portion, in particular, in a planar corner portion.

Generally, the Low-k film is characterized by having a lower Young's modulus compared to an oxide film such as a TEOS film, a FSG (Fluorinated Silicate Glass) film, a PSG (Phospho-Silicate Glass) film, and a BPSG (Boron Phosphorous Silicate Glass) film. On the other hand, a SiCN film, a SiN film, and a SiCO film used for the cap insulator of the buried wire having the main electric conductive layer made of copper or copper alloy are characterized by having a higher Young's modulus compared to an oxide film such as a TEOS film, a FSG film, a PSG film, and a BPSG film. Also, many of the Low-k films have a porous property, and such a porous Low-k film is characterized by having a low degree of adhesion to another thin film.

As a result of the stress analysis by the present inventors, it is found that a high shear stress occurs in the vicinity of the arrow C (cf. FIG. 3) in the planar corner portion of the chip in the thermal cycle test.

When the semiconductor device sealed with resin is exposed to a low temperature side in the thermal cycle test, the resin having a larger linear expansion coefficient than a silicon substrate shrinks more than the silicon substrate and the like, and as a result, the shear stress occurs in a plane of the chip. More particularly, the high shear stress occurs in the planar corner portion of the chip. In the interlayer insulator 7 formed on the semiconductor substrate 1 made of silicon having a high rigidity, a shear deformation occurs in an in-plane center direction (direction of the arrow A) of the semiconductor device (chip) by the shrinkage of the resin. At this time, a deformation of the Low-k film (interlayer insulator 7) having a low Young's modulus becomes large, and the shear deformation becomes large on the lower surface of the Low-k film bonded to a film having a high Young's modulus (cap insulator 6), so that the high shear stress occurs. More particularly, in a thin-film stacked structure having a plurality of stacked structures formed from the cap insulator having high Young's modulus and the Low-k film having low Young's modulus, the shear stress becomes highest at an interface between the low dielectric constant film and the cap insulator on the closest side to the semiconductor substrate 1 (interface between the interlayer insulator 7 and the cap insulator 6). Also, as described above, since the interlayer insulator 7 made of a Low-k film has the low degree of adhesion to another thin film, it has been found that the peeling occurs at the interface where the shear stress is highest. Therefore, it has been revealed that the peeling occurs in the arrow C portion shown in FIG. 3.

Based on the knowledge described above, embodiments of the present invention will be described below in detail with reference to the accompanying drawings.

First Embodiment

Hereinafter, the first embodiment will be described in detail with reference to FIG. 4 to FIG. 14.

Figure 4:
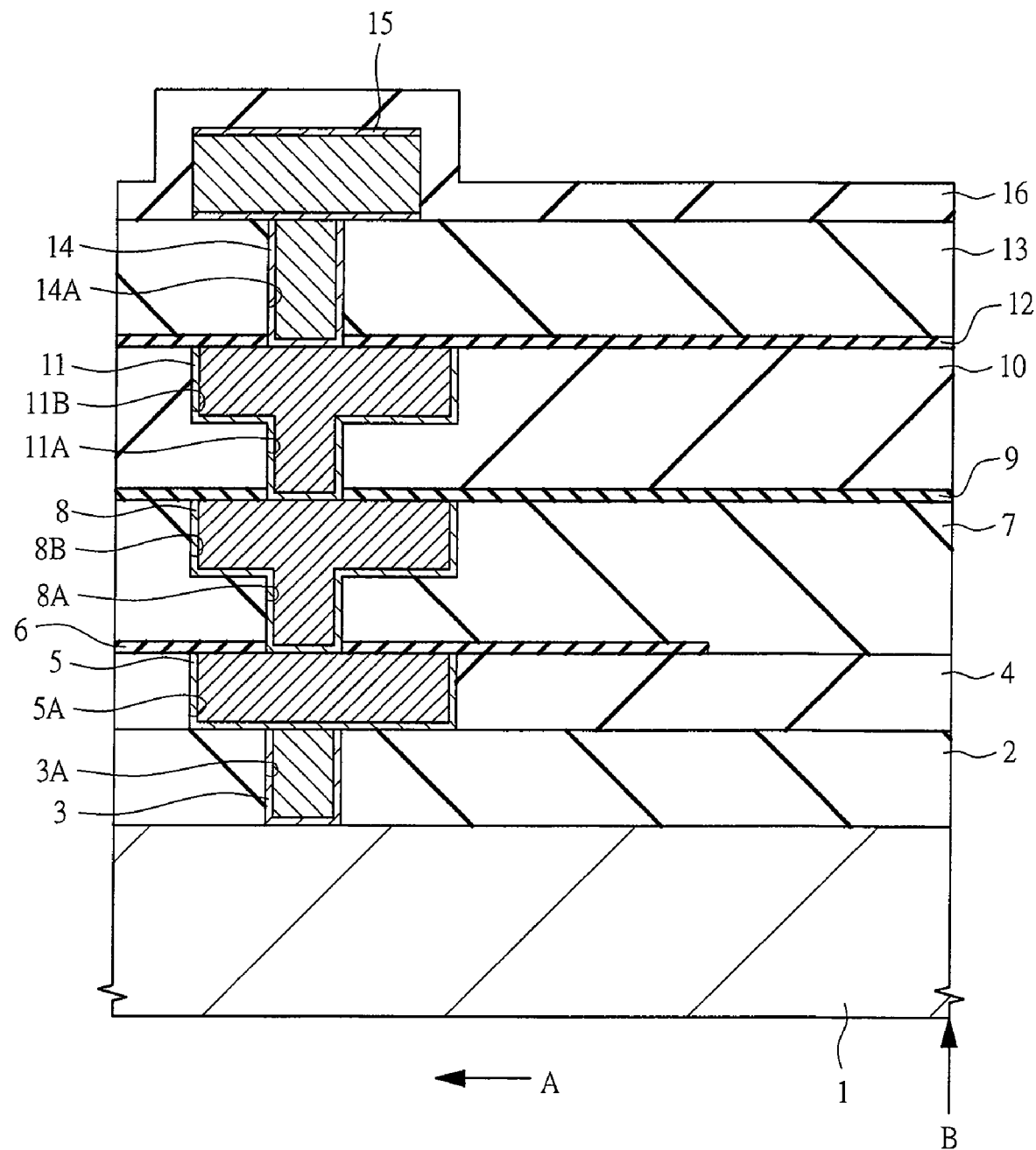
FIG. 4 is a cross section diagram of a principal part of the semiconductor device according to a first embodiment of the present invention.

FIG. 4 is a cross section diagram of a principal part in a vicinity of an edge portion of a semiconductor device (chip) according to the first embodiment. In FIG. 4, an arrow A indicates an inward direction of the semiconductor device, and an arrow B indicates an edge portion of the semiconductor device. A circuit formation region where a semiconductor element, a wire and the like are formed is defined by the side of the arrow A.

In the semiconductor device according to the first embodiment, for example, interlayer insulators (first insulator) 2 and 4 are formed on a main surface of the semiconductor substrate 1 made of single crystal silicon or the like, and the via 3 and the buried wire (first wire) 5 are formed in these interlayer insulators 2 and 4. The interlayer insulators 2 and 4 are formed from, for example, a BPSG (Boron-doped Phospho Silicate Glass) film, a SOG (Spin On Glass) film, a TEOS (Tetra-Ethyl-Ortho-Silicate) film, a silicon oxide film formed by CVD (Chemical Vapor Deposition) method, a silicon oxide film formed by sputtering method, or a stacked structure of a silicon oxide film and a silicon nitride film. The via 3 is formed by, for example, filling a stacked structure of a barrier electric conductive film and tungsten, poly-crystal silicon, copper, or these materials in the via hole 3A formed in the interlayer insulator 2. The buried wire 5 is formed by filling a stacked structure of a barrier electric conductive film and an electric conductive film such as a copper film or a copper alloy film in the trench (first trench portion) 5A for the buried wire formation formed in the interlayer insulator 4. The cap insulator (second insulator) 6 for preventing a diffusion of copper is formed on the upper surface of the buried wire 5, and the interlayer insulator (third insulator) 7 made of a Low-k film is formed on the upper surface of the cap insulator 6.

The buried wire 5 includes not only a wire made of copper but also a wire made of an alloy containing copper as a main component and a wire having a coating layer such as a Ta (tantalum) film, a TaN (tantalum nitride) film, a TiN (titanium nitride) film, a Ru (ruthenium) film, or a Ru alloy film on its surface. Also, the buried wire 5 may include a metal film such as CoWP and W. For example, the buried wire 5 may have a structure in which a Ta film, a TaN film, or a stacked film thereof is coated on a bottom surface and a side surface of a main electric conductive layer made of copper or a structure made of an alloy containing a few percent of aluminum.

The cap insulator 6 is made of, for example, a SiN film, a SiCN film, a SiCO film, or a stacked film thereof (for example, a stacked structure in which a SiCO film is formed on a SiCN film).

Note that the Low-k film in the present embodiment is an interlayer insulator having Young's modulus of about 25 GPa or less, and generally, the Low-k film may be an interlayer insulator called a ULK (Ultra Low-k) film and an ELK (Extremely Low-k) film.

The contact hole (third trench portion) 8A and the trench (third trench portion) 8B are formed in the interlayer insulator 7 and the cap insulator 6, and the buried wire (third wire) 8 is formed in the contact hole 8A and the trench 8B by a so-called damascene process. Also, the cap insulator (second insulator) 9, the interlayer insulator 10, and the buried wire 11 (including the contact hole 11A and the trench 11B) similar to the cap insulator 6, the interlayer insulator 7, and the buried wire 8 are provided further thereon. The cap insulator (second insulator) 12 similar to the cap insulators 6 and 9 is provided on the upper surface of the buried wire 11.

An interlayer insulator 13 such as a TEOS film, a FSG film, a PSG film, and a BPSG film is formed on the upper surface of these wiring layers, and the via hole 14A and the via 14 are formed in the interlayer insulator 13. For example, a tungsten film or a tungsten film through a barrier metal film is used for the via 14. The barrier metal film is made of a Ti film, a TiN film, or a stacked film thereof. The wire 15 having the main conductive layer made of aluminum to be the uppermost layer and the surface protection film 16 for preventing the intrusion of moisture from the surface are provided through the via 14. The wire 15 may have a structure provided with a barrier metal film made of titanium and TiN on an upper surface and a lower surface thereof. The surface protection film 16 is made of a silicon oxide film such as a SiN film or a TEOS film, a stacked structure thereof, or a multi-layer film in which a polyimide film is further stacked.

The first embodiment is characterized in that the cap insulator 6 of the buried wire 5 is not provided in a predetermined range from the edge portion B of the semiconductor device (chip).

Figure 5:
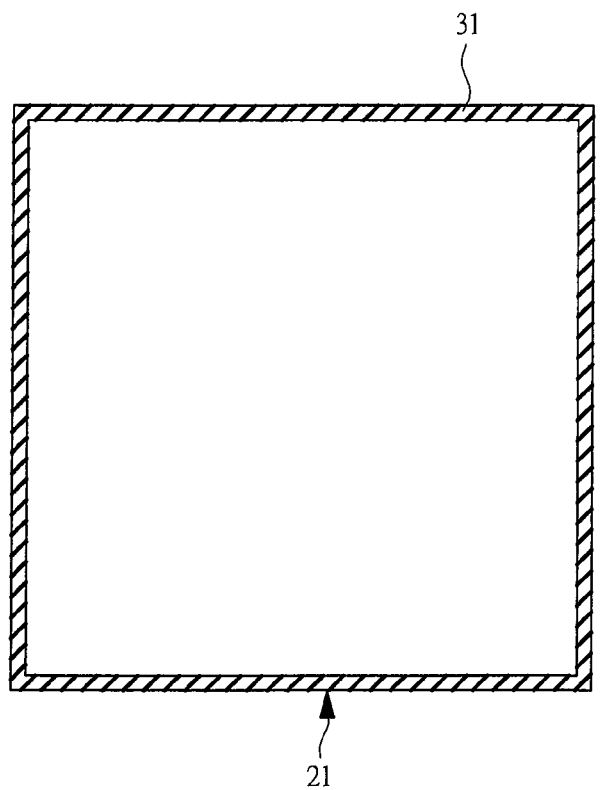
FIG. 5 is a plan view showing a layout of the semiconductor device according to the first embodiment of the present invention.
Figure 6:
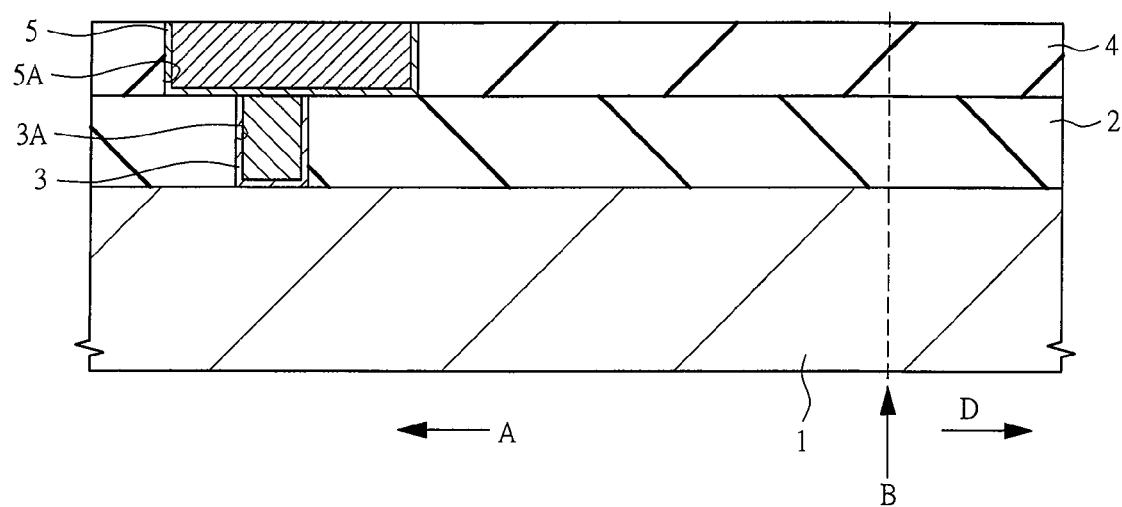
FIG. 6 is a cross section diagram of a principal part for describing a manufacturing process of the semiconductor device according to the first embodiment of the present invention.

Here, the portion where the cap insulator 6 is not provided (hereinafter, referred to as non-providing portion) will be described with reference to FIG. 5. FIG. 5 is a plan view showing a layout of a semiconductor device 21 according to the first embodiment. The non-providing portion (first region) 31 of the cap insulator 6 in the first embodiment is an outer peripheral portion of the semiconductor device 21, and is characterized by including the chip corners (planar corner portions of the chip). The non-providing portion 31 in the first embodiment preferably has a width of at least about 1 μm or more from the edge portion (shown by the arrow B in FIG. 4) of the semiconductor device 21 toward the in-plane center direction (shown by the arrow A in FIG. 4) at the chip corner, and more preferably has a width of about 5 μm or more. This is the range affected by the stress led from the above-described result of the stress analysis in the thermal cycle test.

Next, one example of a manufacturing method of the semiconductor device according to the first embodiment will be described with reference to FIG. 4 and FIG. 6 to FIG. 11. In the figures, arrows A and B indicate an inward direction and an edge portion of the semiconductor device (chip), respectively, similarly to the above-described arrows A and B. Also, a region shown by an arrow D from the edge portion of the semiconductor device is a dicing region that is cut in the division into respective semiconductor devices. Hereinafter, the manufacturing process will be described in respective main processes (1) to (6).

(1) First, a semiconductor element such as a transistor is formed on the main surface of the semiconductor substrate 1, and the interlayer insulators 2 and 4 are formed on the main surface of the semiconductor substrate 1 on which the semiconductor element has been formed. Thereafter, the via hole 3A, the via 3, the trench 5A, and the buried wire 5 formed by the damascene process are formed in the circuit formation region where the semiconductor element has been formed (cf. FIG. 6).

Figure 7:
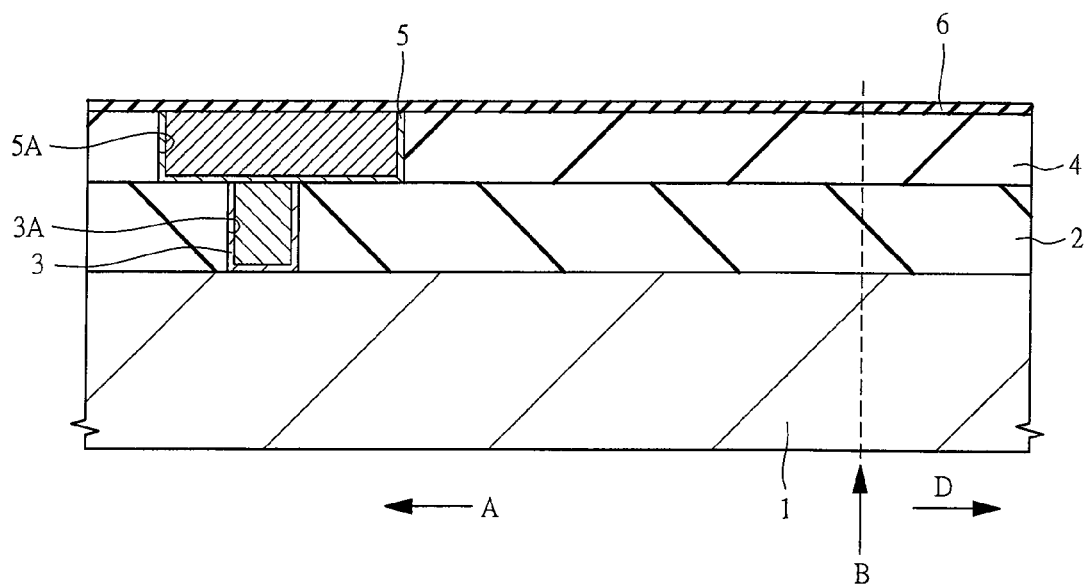
FIG. 7 is a cross section diagram of a principal part in the manufacturing process of the semiconductor device continued from FIG. 6.
Figure 8:
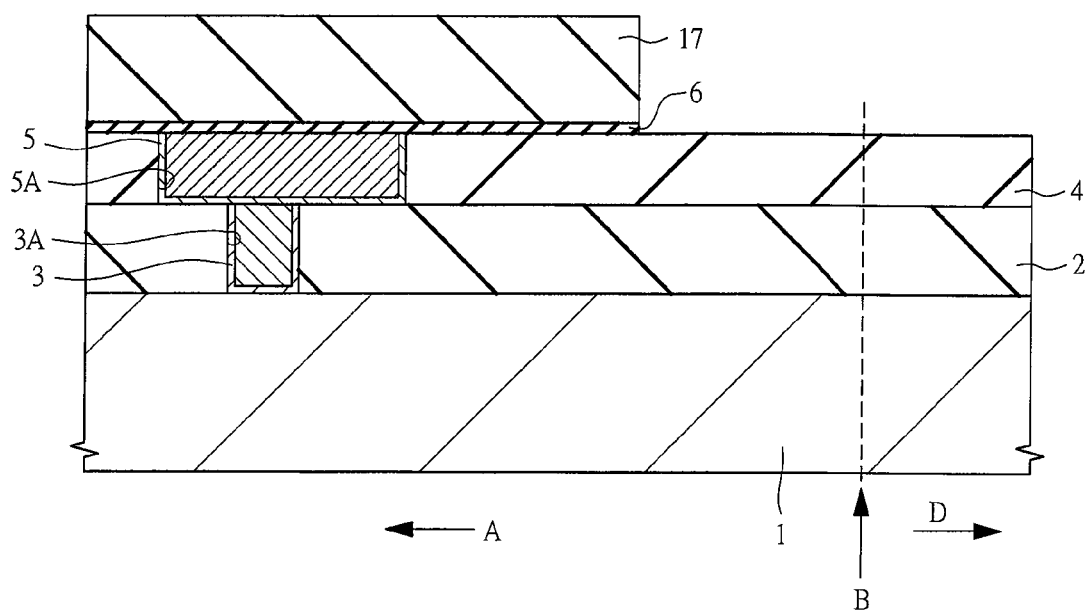
FIG. 8 is a cross section diagram of a principal part in the manufacturing process of the semiconductor device continued from FIG. 7.
Figure 9:
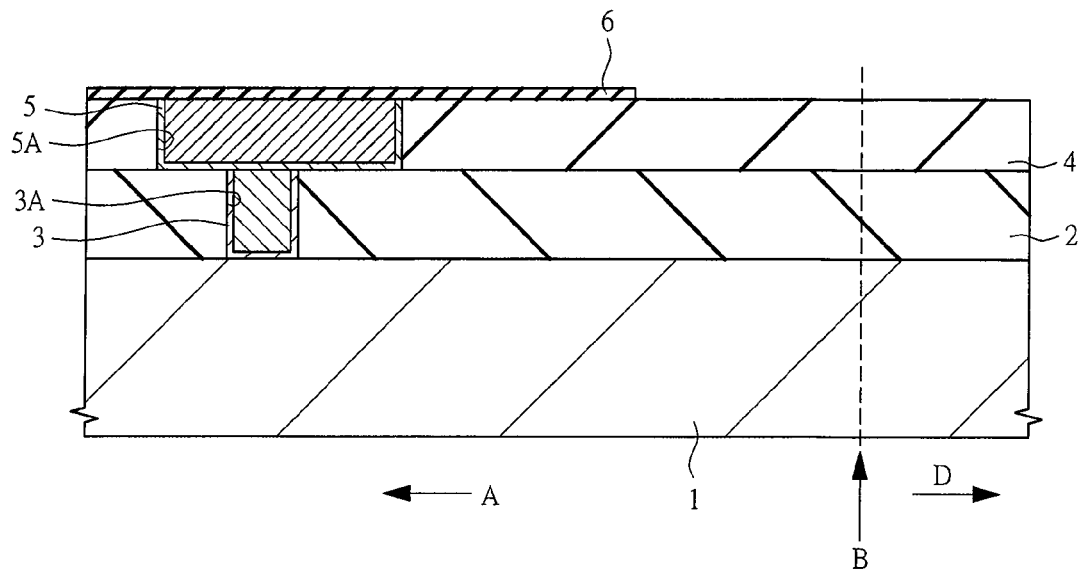
FIG. 9 is a cross section diagram of a principal part in the manufacturing process of the semiconductor device continued from FIG. 8.

(2) Next, the cap insulator 6 of the buried wire 5 is deposited on a whole upper surface of the semiconductor substrate 1 including the edge portion of the semiconductor device and the dicing region (cf. FIG. 7).

(3) Next, after protecting the circuit region with using a photoresist film 17 patterned by a photolithography technique as a mask, the cap insulator 6 in a region to be the edge portion of the semiconductor device is removed by etching. At this time, the cap insulator 6 in the region including the edge portion of the semiconductor device and at least a part of the dicing region is removed (cf. FIG. 8). By setting the region where the cap insulator 6 is to be removed so as to include at least a part of the dicing region, the cap insulator 6 in the edge portion of the semiconductor device can be certainly removed.

Figure 10:
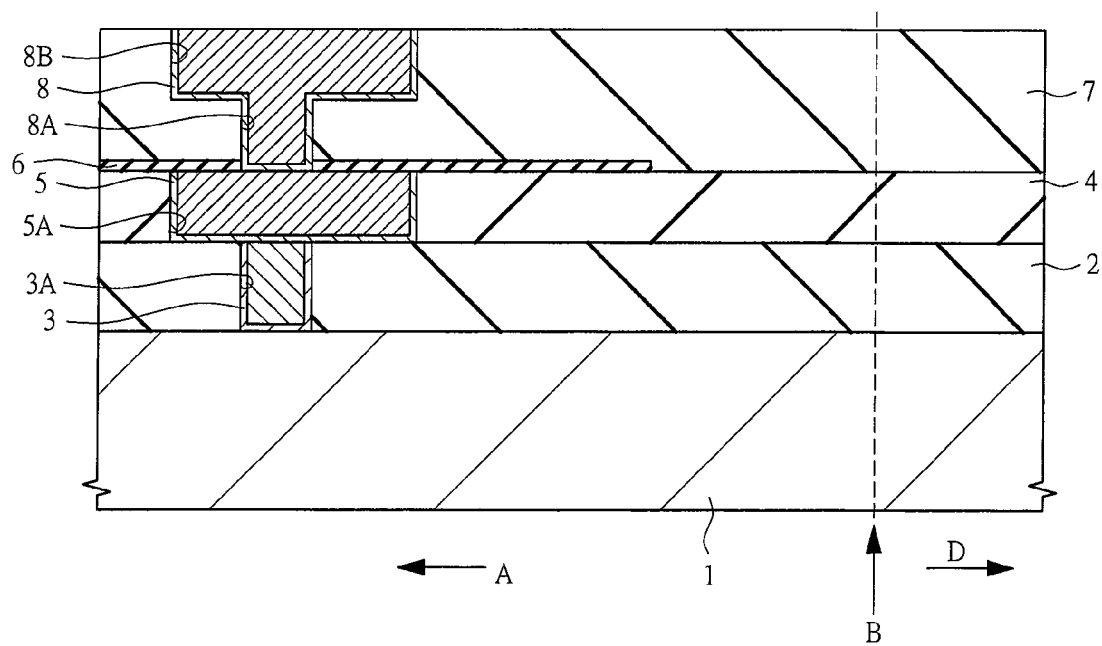
FIG. 10 is a cross section diagram of a principal part in the manufacturing process of the semiconductor device continued from FIG. 9.
Figure 11:
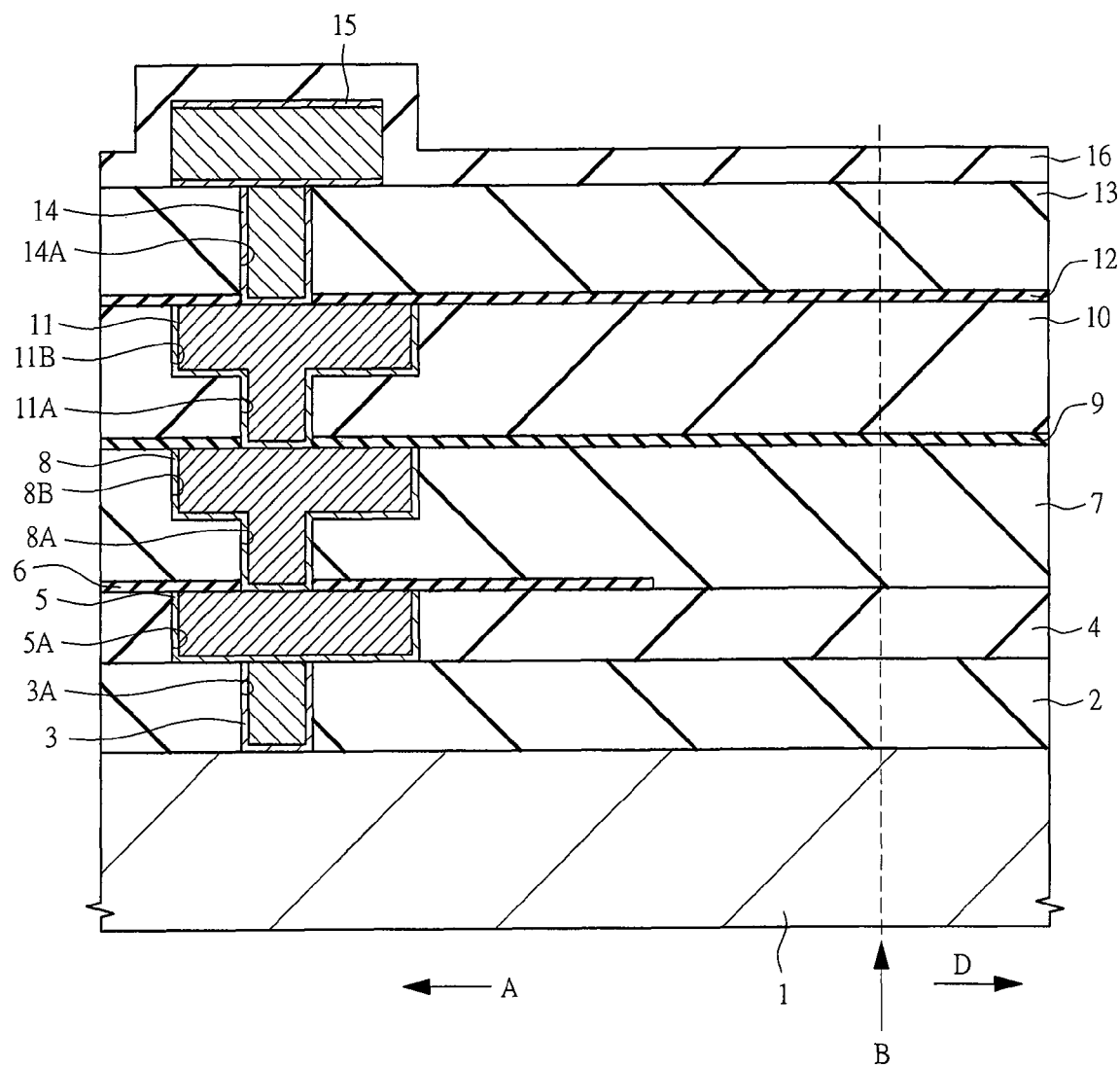
FIG. 11 is a cross section diagram of a principal part in the manufacturing process of the semiconductor device continued from FIG. 10.

(4) After removing the above-described photoresist film 17 (cf. FIG. 9), the interlayer insulator 7, the contact hole 8A reaching the buried wire 5, the trench 8B, and the buried wire 8 formed by the damascene process are formed (cf. FIG. 10).

(5) Through the same processes of forming the cap insulator 6, the interlayer insulator 7, the contact hole 8A, the trench 8B, and the buried wire 8, the cap insulators 9 and 12, the interlayer insulator 10, the contact hole 11A reaching the buried wire 8, the trench 11B, and the buried wire 11 are formed. And then, the interlayer insulator 13, the via hole 14A reaching the buried wire 11, the via 14, the wire 15, and the surface protection film 16 are formed further thereon (cf. FIG. 11).

(6) The semiconductor substrate 1 is cut in the dicing region at a border of the arrow B by dicing, and then processed into a desired semiconductor device (chip) (cf. FIG. 4).

Next, an operational effect of the above-described semiconductor device according to the first embodiment will be described.

In the semiconductor device described above with reference to FIG. 1 to FIG. 3, the cap insulator 6 of the buried wiring layer having the main electric conductive layer made of copper and having a Low-k film as its interlayer insulator is formed up to the edge portion of the semiconductor device (chip) (cf. FIG. 1). On the other hand, in the semiconductor device according to the first embodiment, in the multi-layer structure in which the interlayer insulator made of the Low-k film, the buried wire having the main electric conductive film made of copper, and the cap insulator having a higher Young's modulus than the interlayer insulator are formed, the cap insulator 6 which is closest to the semiconductor substrate 1 among a plurality of cap insulators is not provided in the predetermined region from the edge portion B of the semiconductor device. A difference in Young's modulus at the interface between the cap insulator and the interlayer insulator made of the Low-k film becomes larger as closer to the semiconductor substrate 1 made of single crystal silicon. However, according to the first embodiment, it is possible to prevent the interface between the cap insulator 6 and the interlayer insulator 7 where the difference in Young's modulus is largest from being exposed to the edge portion of the semiconductor device (chip). Therefore, it is possible to suppress the increase of the shear stress at the interface between the cap insulator 6 and the interlayer insulator 7 caused by the influence of the thermal shrinkage by the resin in the thermal cycle test in an assembly process after sealing the semiconductor device with resin. By this means, the occurrence of the peeling at the interface (arrow C portion) between the cap insulator 6 and the interlayer insulator 7 in the edge portion of the semiconductor device described above with reference to FIG. 3 can be prevented.

Also, in the semiconductor device according to the first embodiment, the non-providing portion of the cap insulator 6 includes the chip corner as shown in FIG. 5. Accordingly, the shear stress acting to the chip corner where the above-described shear stress concentrates can be reduced, so that the occurrence of the peeling between the cap insulator 6 and the interlayer insulator 7 can be prevented.

Further, the package form of the semiconductor device according to the first embodiment is not limited to the above-described structure shown in FIG. 2. The package form according to the first embodiment can be that shown in FIG. 12 and that shown in FIG. 13 as long as it is sealed with resin.

Figure 12:
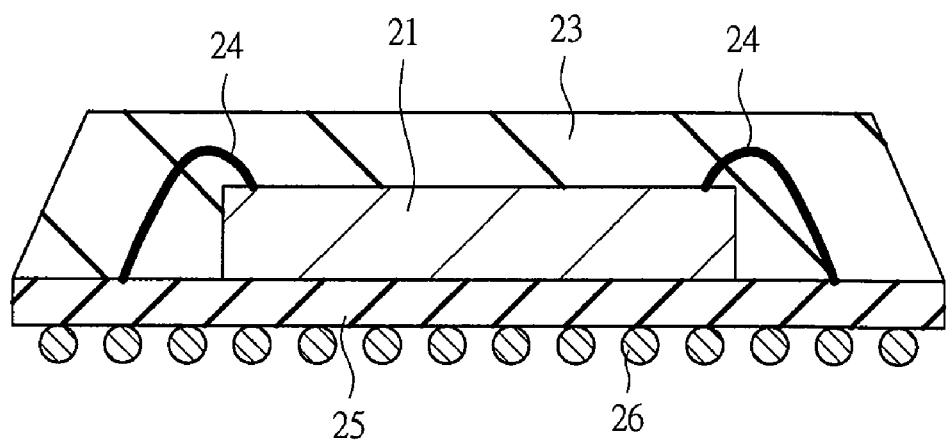
FIG. 12 is a cross section diagram of a principal part for describing a package form of the semiconductor device according to the first embodiment of the present invention.

The package form shown in FIG. 12 has a structure in which the semiconductor device 21 and a mounting board 25 are electrically connected by metal wires (bonding wire) 24 and sealed with resin 23, and solder balls 26 are disposed on a lower surface of the mounting board 25.

Figure 13:
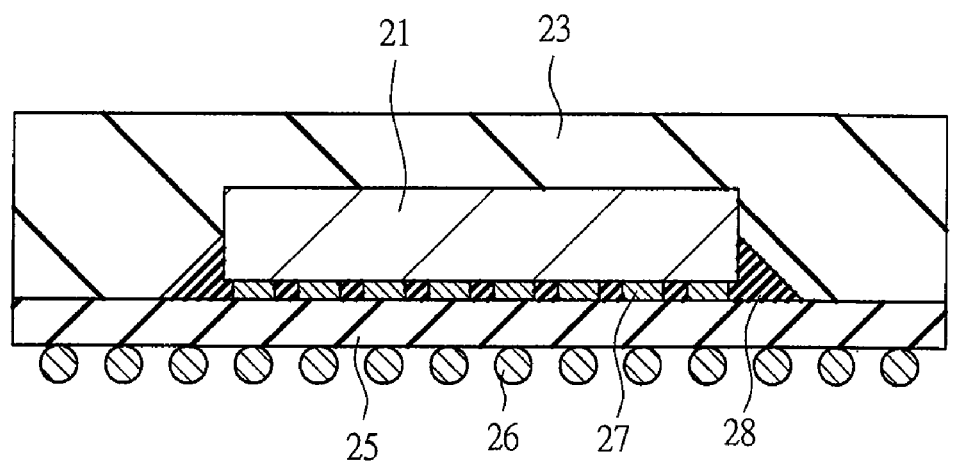
FIG. 13 is a cross section diagram of a principal part for describing a package form of the semiconductor device according to the first embodiment of the present invention.

The package form shown in FIG. 13 has a structure in which the semiconductor device 21 and the mounting board 25 are electrically connected by, for example, gold bumps 27 and the like and sealed with underfill resin 28 and the resin 23, and the solder balls 26 are disposed on a lower surface of the mounting board 25.

Figure 14:
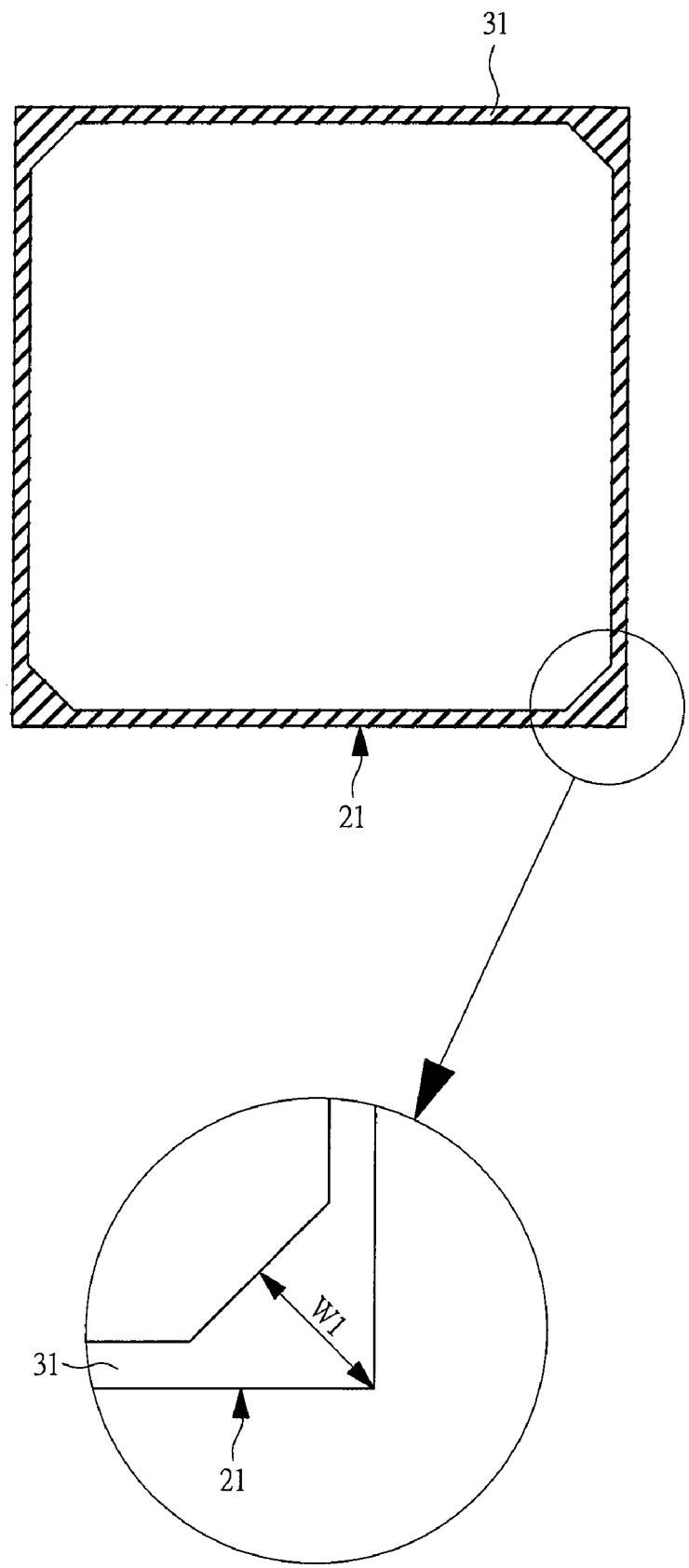
FIG. 14 is a plan view showing a layout of the semiconductor device according to the first embodiment of the present invention.

Also, the non-providing portion 31 of the cap insulator 6 can be widely provided at the chip corners as shown in FIG. 14. In the distribution of the stress from the edge portion of the semiconductor device toward the center direction, the stress from the chip corners is higher even at the position apart from the edge portion compared to the stress from the four sides. Accordingly, by forming the non-providing portion 31 of the cap insulator 6 widely at the chip corner portions and narrowly at the side portions, the non-providing portion 31 of the cap insulator 6 can be made as small as possible. By this means, an effect of extending the circuit formation region can be obtained. At this time, a width W1 of the non-providing portion 31 of the cap insulator 6 from the chip corner is preferably set to at least about 1 µm or more, and more preferably set to about 5 µm or more.

Further, as described above, the surface protection film 16 may include the structure in which a polyimide film is stacked on the stacked film of a silicon oxide film and a SiN film. In this case, in terms of a plurality of interfaces formed by a plurality of insulators formed on the semiconductor substrate 1, an interface having a largest difference in Young's modulus is not the interface between the cap insulator 6 and the interlayer insulator 7 made of the Low-k film but the interface between the SiN film and the polyimide film forming the surface protection film in some cases. However, since the Low-k film has a lower degree of adhesion to a base material than the polyimide film, the interface between the interlayer insulator 7 and the cap insulator 6 is an interface where the peeling is most likely to occur among the plurality of interfaces formed by the plurality of insulators formed on the semiconductor substrate 1. In other words, the interface having the largest difference in Young's modulus in the first embodiment is the interface formed by the insulators below the surface protection film 16 on the semiconductor substrate 1 side.

Second Embodiment

Figure 15:
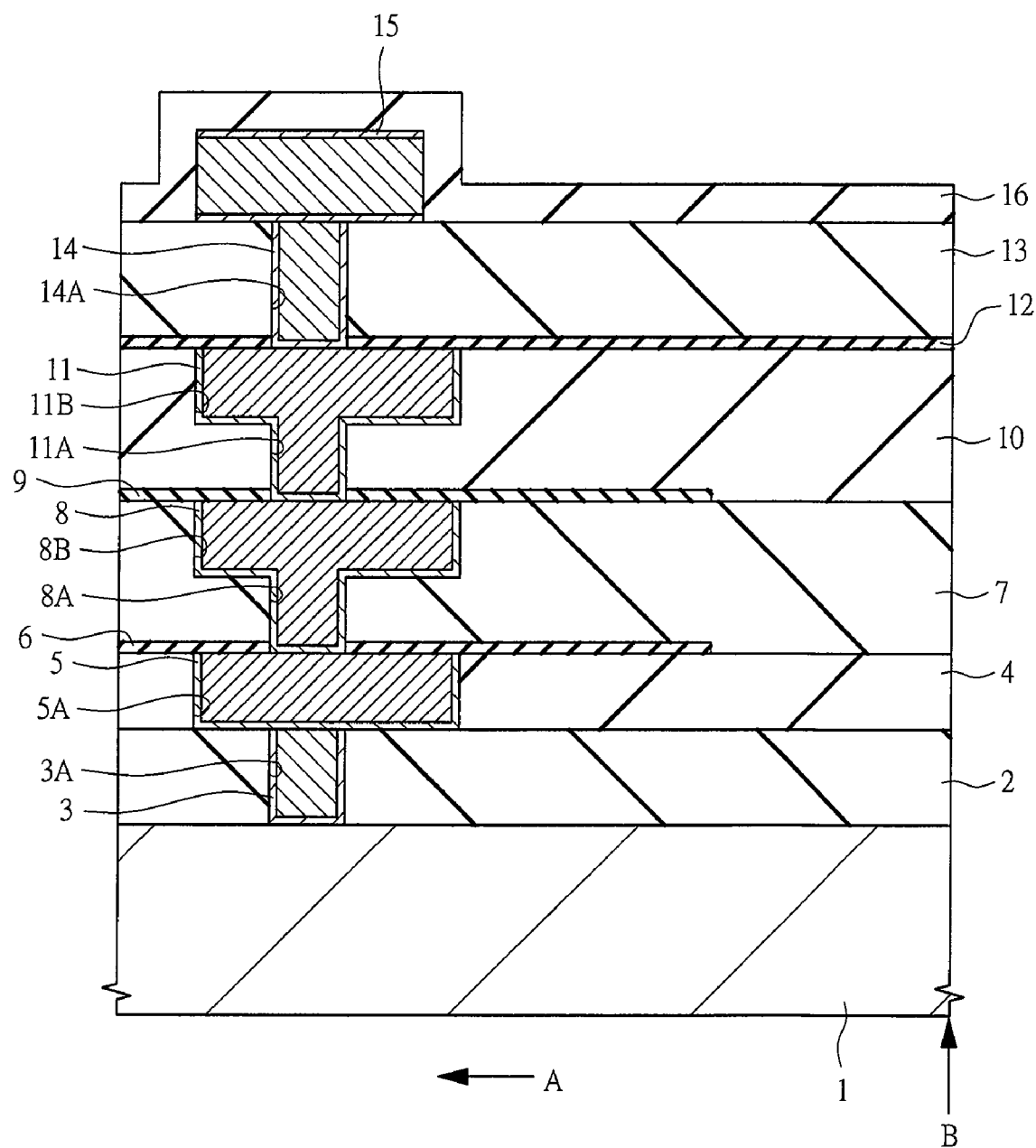
FIG. 15 is a cross section diagram of a principal part of a semiconductor device according to a second embodiment of the present invention.

Next, a second embodiment will be described in detail with reference to the drawings. FIG. 15 is a cross section diagram of a principal part in a vicinity of an edge portion of a semiconductor device (chip) according to the second embodiment.

The difference between the first embodiment and the second embodiment lies in that not only the cap insulator 6 but also the cap insulator 9 is not provided in the edge portion of the semiconductor device.

Hereinafter, an operational effect of the semiconductor device according to the second embodiment will be described.

In the case where the interlayer insulator made of a Low-k film having relatively low Young's modulus and the cap insulator having relatively high Young's modulus are stacked in combination, the stress at the closest interface to the semiconductor substrate 1 is largest. However, depending on a form, a structure, and a material to package the semiconductor device or a use environment of the package, the stress that causes the peeling may occur even at the second and subsequent interfaces from the semiconductor substrate 1.

Hence, in the second embodiment, also at the second interface from the semiconductor substrate 1, which is formed by the cap insulator 9 and the interlayer insulator 10 made of a Low-k film and has the large difference in Young's modulus, the cap insulator 9 is not provided in the edge portion of the semiconductor device. By this means, it is possible to obtain a more reliable semiconductor device in which the possibility of the occurrence of the peeling at the interface between the cap insulator and the interlayer insulator made of a Low-k film is lowered. Further, also when the interlayer insulator made of a Low-k film, the buried wire, and the cap insulator are formed in more multiple layers, the cap insulator other than that closest to the semiconductor substrate 1 can be formed so as not to be provided in the edge portion of the semiconductor device like in the second embodiment.

Third Embodiment

Figure 16:
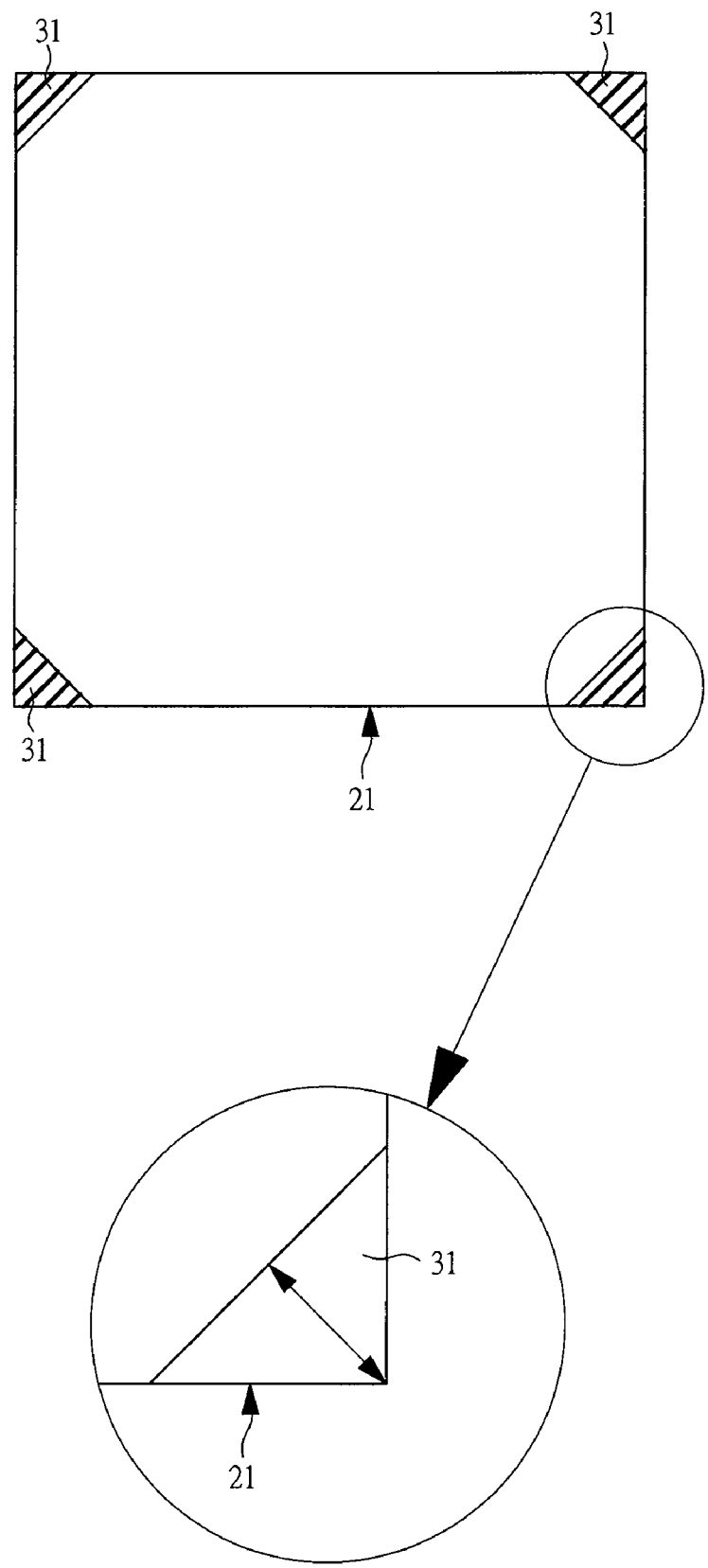
FIG. 16 is a plan view showing a layout of a semiconductor device according to a third embodiment of the present invention.

Next, the third embodiment will be described in detail with reference to FIG. 16. FIG. 16 is a planar layout diagram for describing the non-providing portion 31 of the cap insulator 6 (cf. FIG. 4 as well) in a semiconductor device according to the third embodiment.

The difference between the third embodiment and the first embodiment lies in that the non-providing portion 31 of the cap insulator 6 is formed only in the vicinity of the chip corners of the semiconductor device 21. The non-providing portion 31 according to the third embodiment has a width of at least about 1 μm or more from the chip corner toward the in-plane center direction, and more preferably has a width of about 5 μm or more.

Hereinafter, an operational effect of the semiconductor device according to the third embodiment will be described.

As described in the first embodiment, the stress generated in the thermal cycle test in the assembly process after sealing the semiconductor device 21 with resin acts most to the chip corner of the semiconductor device 21. According to the semiconductor device 21 of the third embodiment, the non-providing portion 31 of the cap insulator 6 is provided only at the chip corners of the semiconductor device 21, thereby minimizing the non-providing portion 31 of the cap insulator 6. Accordingly, an effect of extending the circuit formation region to maximum can be obtained.

Fourth Embodiment

Next, the fourth embodiment will be described in detail with reference to FIG. 17 and FIG. 18.

Figure 17:
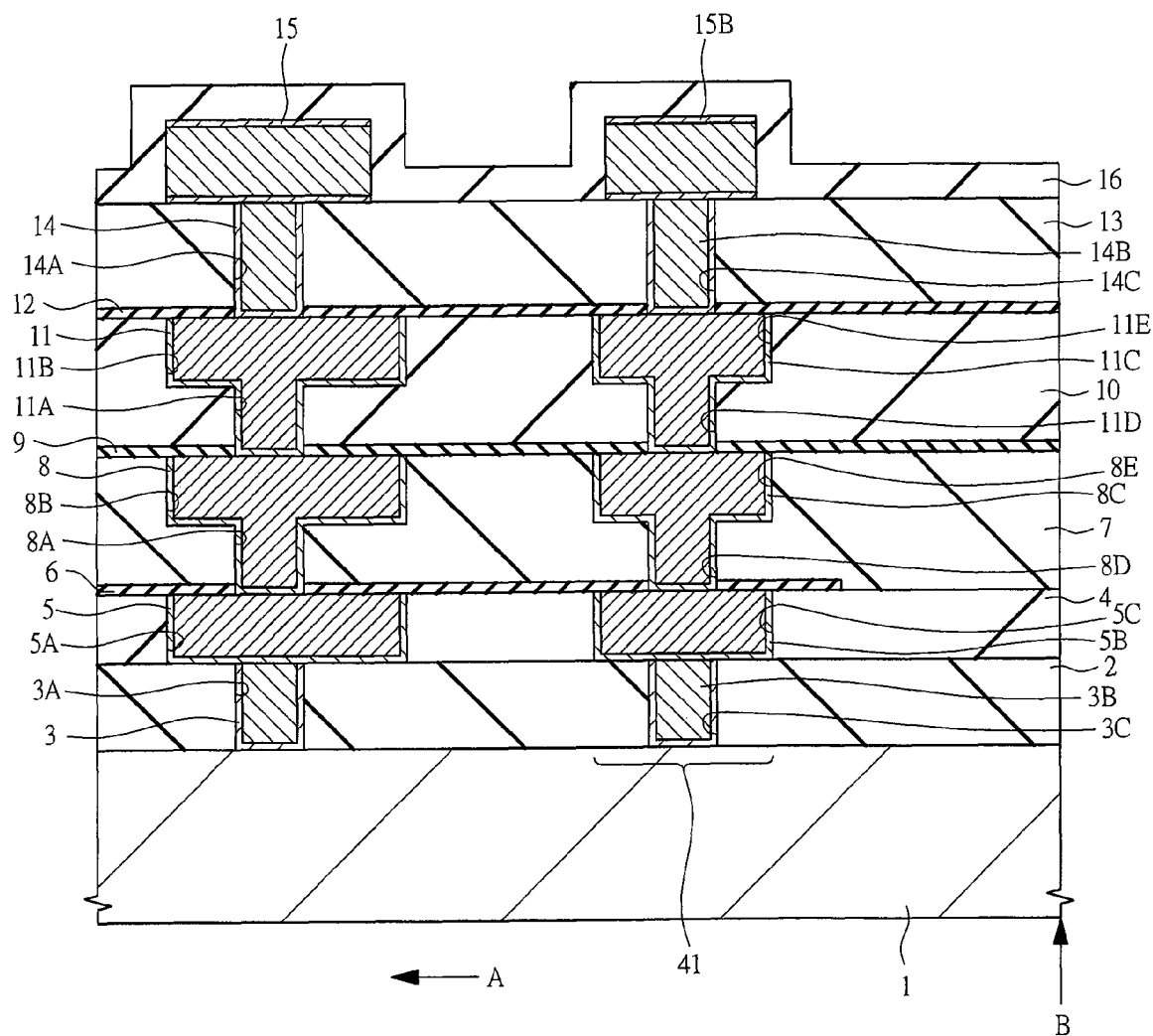
FIG. 17 is a cross section diagram of a principal part of a semiconductor device according to a fourth embodiment of the present invention.

FIG. 17 is a cross section diagram of a principal part in a vicinity of the edge portion of the semiconductor device (chip) according to the fourth embodiment. The difference between the fourth embodiment and the first to third embodiments lies in that a guard ring wire 41 is provided in the outer periphery of the circuit formation region, and the fourth embodiment is characterized in that the non-providing portion 31 of the cap insulator 6 provided in the edge portion (shown by the arrow B) of the semiconductor device does not overlap with the guard ring wire 41.

The guard ring wire 41 is formed so as to be a protection wall to prevent the intrusion of moisture into the circuit formation region, and is formed by stacking metal portions such as the buried wires 5B (including a trench (second trench portion) 5C), 8C (including a contact hole 8D and a trench 8E) and 11C (including a contact hole 11D and a trench 11E), the wire 15B, and the vias 3B (including a via hole 3C) and 14B (including a via hole 14C) so as to penetrate through the interlayer insulators 2, 4, 7, 10 and 13. The guard ring wire 41 as described above can be formed as the same wiring layers and through the same processes as the buried wires 5 (including the trench 5A), 8 (including the contact hole 8A and the trench 8B) and 11 (including the contact hole 11A and the trench 11B), the wire 15 and the via 3 (including the via hole 3A) and 14 (including the via hole 14A) in the circuit formation region. Also, when a crack occurs in the edge portion of the semiconductor device (chip), the guard ring wire 41 functions to prevent the extension of the crack to the circuit formation region.

Figure 18:
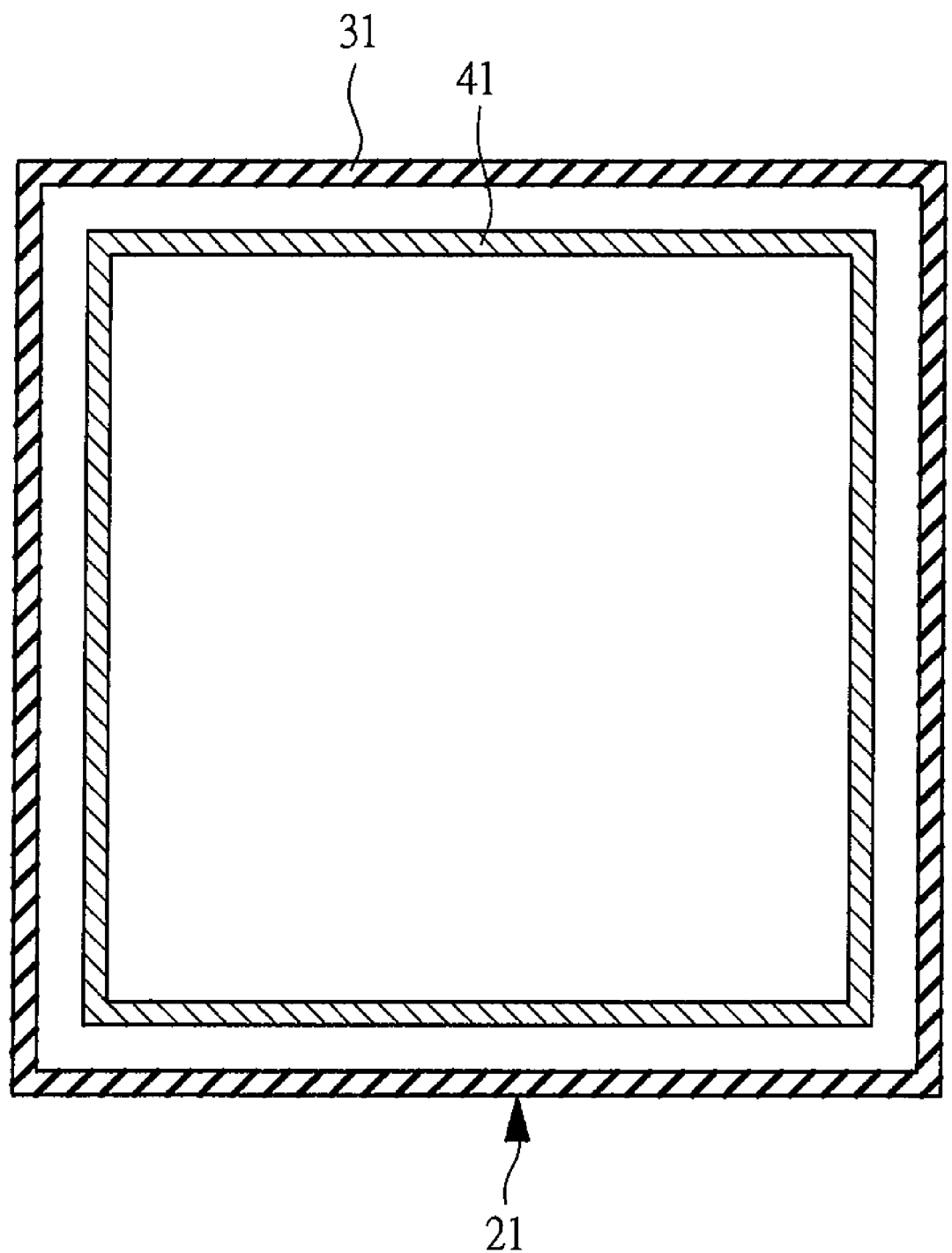
FIG. 18 is a plan view showing a layout of the semiconductor device according to the fourth embodiment of the present invention.

FIG. 18 shows a planar layout of the semiconductor device (chip) 21 according to the fourth embodiment. In the semiconductor device 21 according to the fourth embodiment, the non-providing portion 31 of the cap insulator 6 is provided in the edge portion of the semiconductor device 21, and the guard ring wire 41 is formed on an inner side of the non-providing portion 31.

Hereinafter, an operational effect of the semiconductor device 21 according to the fourth embodiment will be described.

According to the fourth embodiment, the peeling of the interlayer insulator 7 and the cap insulator 6 from the edge portion of the semiconductor device 21 can be prevented, and at the same time, the buried wire (second wire) 5B forming the guard ring wire 41 can have a structure in which an upper portion of the buried wire 5B is covered with the cap insulator 6. Therefore, it is possible to prevent the diffusion of copper from the buried wire 5B.

Note that, in the fourth embodiment, a positional relationship of the guard ring wire 41 and the non-providing portion 31 of the cap insulator 6 is described. The structure of the guard ring wire 41 may be the one other than that exemplified in the fourth embodiment.

Note that the guard ring wire 41 according to the fourth embodiment may have a sacrifice pattern as disclosed in, for example, Japanese Patent Application Laid-Open Publication No. 2006-80369 (Patent Document 2). In this case, the non-providing portion 31 of the cap insulator 6 is defined in a region not including the sacrifice pattern.

Further, the non-providing portion 31 of the cap insulator 6 according to the fourth embodiment is provided in the outer periphery of the semiconductor device. However, it may be provided only at the chip corners like in the third embodiment (cf. FIG. 16).

Fifth Embodiment

Next, a fifth embodiment will be described in detail with reference to FIG. 19.

Figure 19:
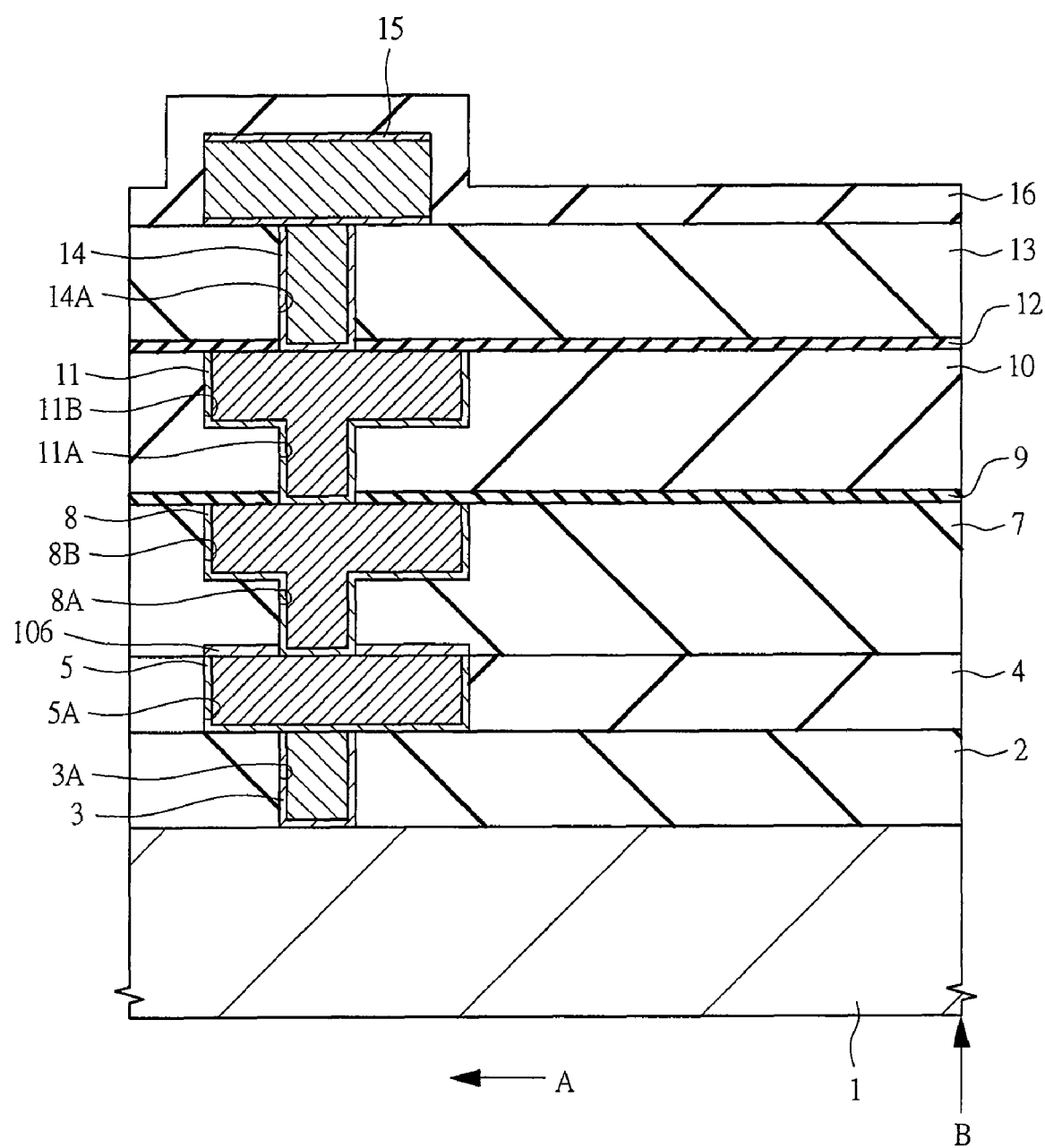
FIG. 19 is a cross section diagram of a principal part of a semiconductor device according to a fifth embodiment of the present invention.

FIG. 19 is a cross section diagram of a principal part in a vicinity of the edge portion of the semiconductor device (chip) according to the fifth embodiment. The difference between the fifth embodiment and the first to fourth embodiments lies in that a cap metal film 106 for preventing the diffusion of copper is formed on the upper surface of the buried wire 5. The cap metal film 106 is made of, for example, a Co film, a W film, a CoW film, a CoWP film, a CoWB film, a Co alloy film, a Cu silicide film, a Ru film, a Ni film, a Ni alloy film, or a stacked structure thereof. The cap metal film is deposited by electroless plating method, electro-plating method, sputtering method, CVD method, or the like.

The fifth embodiment is characterized in that the cap metal film 106 is used for at least the buried wire 5 in the lowermost layer close to a Si substrate (semiconductor substrate 1) side among copper wiring layers having a Low-k film as the interlayer insulator of an upper layer.

Next, an operational effect of the semiconductor device according to the above-described fifth embodiment will be described.

In the semiconductor device according to the fifth embodiment, a portion where the interface between the cap insulator and the interlayer insulator having the largest difference in Young's modulus is exposed in the edge portion of the semiconductor device (chip) can be separated from the Si substrate compared to the semiconductor device of FIG. 2 described above. Accordingly, it is possible to prevent the occurrence of the peeling at the interface between the cap insulator 6 and the interlayer insulator 7 (arrow C portion) in the edge portion of the semiconductor device described above with reference to FIG. 3.

Also, in the semiconductor device according to the fifth embodiment, the cap metal film 106 of the copper wire is provided at least in the lowermost layer of the copper wire close to the Si substrate side, and the cap films of the other copper wires are made of, for example, a SiN film, a SiCN film, a SiCO film, or a stacked film thereof (for example, a stacked structure in which a SiCO film is formed on a SiCN film). By using the cap film (insulator) of a conventional technique for the upper layers having a less possibility of the peeling as described above, it is possible to suppress the manufacturing cost compared to the case where the cap metal film is used for all layers. Also, a highly reliable semiconductor device can be obtained.

Note that, in the semiconductor device according to the fifth embodiment shown in FIG. 19, the cap metal film 106 is used for only the cap film of the buried wire 5. However, the use of the cap metal film is not limited to the one buried wire in the lowermost layer. For example, the cap metal films may be used for all of the cap films of the buried wires having the interlayer insulator of the low dielectric constant film in the upper layer.

Also, the semiconductor device according to the fifth embodiment shown in FIG. 19 is characterized in that the cap metal film 106 is used for the buried wire 5 having the interlayer insulator 7 made of a Low-k film as the upper layer and positioned in the lowermost layer closest to the Si substrate side. However, when a combination of a copper wire and an interlayer insulator having a lower Young's modulus than the interlayer insulator 7 exists in the further upper layer, the cap metal film can be used for the copper wire. In that case, the cap insulator may be used for the copper wire in the lower layer.

In the foregoing, the present invention made by the inventors has been concretely described based on the embodiments. However, the present invention is not limited to the foregoing embodiments and various modifications and alterations can be made within the scope of the present invention.

The structure of the semiconductor device according to the present invention can be applied to a semiconductor device having a structure in which a Low-k film having a relatively low Young's modulus is used as an interlayer insulator, a buried wire having a main electric conductive layer made of copper or copper alloy is formed, and the buried wire is covered with a cap insulator having a relatively high Young's modulus.

What is claimed is:

1. A semiconductor device comprising a semiconductor chip of a planer rectangular shape, wherein
the semiconductor chip includes:
a semiconductor substrate having a semiconductor element formed on a main surface thereof and patterned into the planer rectangular shape;
a first insulator formed on the main surface of the semiconductor substrate;
a first wire formed by filling an electric conductive film in a first trench portion formed in the first insulator;
a second insulator formed on the first insulator and the first wire; and
a third insulator formed on the second insulator so as to contact the second insulator,
wherein the second insulator has a higher Young's modulus compared to the third insulator,
wherein the second insulator is made of a SiN film, a SiCN film, a SiCO film, or a stacked film thereof,
wherein the third insulator is a film formed closest to the semiconductor substrate side of films made of a material having a relatively lower dielectric constant than a silicon oxide film deposited by CVD method,
wherein the second insulator is removed in only a first region corresponding to a planar outer periphery of the semiconductor chip, and
wherein the semiconductor chip is sealed by a resin.

2. The semiconductor device according to claim 1, wherein the electric conductive film contains copper as a main component.

3. The semiconductor device according to claim 1, wherein the first region includes at least a planar corner portion of the semiconductor chip.

4. The semiconductor device according to claim 3, wherein the first region includes at least a region of 1 μm to 5 μm from the planar corner portion of the semiconductor chip.

5. The semiconductor device according to claim 4, wherein the first region includes at least a region of 1 μm to 5 μm from planar four sides of the semiconductor chip.

6. The semiconductor device according to claim 5, wherein a width of the first region from the planar corner portion of the semiconductor chip is larger than that from the planar four sides.

7. The semiconductor device according to claim 1, wherein
a circuit formation region is defined in a plane in the semiconductor chip,
the first wire is formed within the circuit formation region in a plane,
a second trench portion is formed in the first insulator so as to surround the circuit formation region in a plane,
a second wire is formed by filling the electric conductive film in the second trench portion, and
the first region is arranged outside the second wire in a plane.

8. The semiconductor device according to claim 1, further comprising:
a third wire formed by filling the electric conductive film in a third trench portion formed in the third insulator, wherein
a plurality of wiring layers are formed on the main surface of the semiconductor substrate,
the plurality of the wiring layers are formed by stacking the third insulator, the third wire, and the second insulator, and
at least the second insulator in the lowermost layer among the plurality of layers of the second insulators is removed in the first region.

9. A semiconductor device comprising a semiconductor chip of a planer rectangular shape, wherein
the semiconductor chip includes:
a semiconductor substrate having a semiconductor element formed on a main surface thereof and patterned into the planer rectangular shape;
a first insulator formed on the main surface of the semiconductor substrate;
a first wire formed by filling an electric conductive film in a first trench portion formed in the first insulator;
a second insulator formed on the first insulator and the first wire; and
a third insulator formed on the second insulator so as to contact the second insulator,
the third insulator has a lower degree of adhesion with upper- and lower-layer films compared to the second insulator,
the second insulator is made of a SiN film, a SiCN film, a SiCO film, or a stacked film thereof,
the third insulator is a film formed closest to the semiconductor substrate side of films made of a material having a relatively lower dielectric constant than a silicon oxide film deposited by CVD method,
the second insulator is removed in only a first region corresponding to a planar outer periphery of the semiconductor chip, and
the semiconductor chip is sealed by a resin.

10. The semiconductor device according to claim 9, wherein
the electric conductive film contains copper as a main component.

11. The semiconductor device according to claim 9, wherein
the first region includes at least a planar corner portion of the semiconductor chip.

12. The semiconductor device according to claim 11, wherein
the first region includes at least a region of 1 μm to 5 μm from the planar corner portion of the semiconductor chip.

13. The semiconductor device according to claim 12, wherein
the first region includes at least a region of 1 μm to 5 μm from planar four sides of the semiconductor chip.

14. The semiconductor device according to claim 13, wherein
a width of the first region from the planar corner portion of the semiconductor chip is larger than that from the planar four sides.

15. The semiconductor device according to claim 9, wherein
a circuit formation region is defined in a plane in the semiconductor chip,
the first wire is formed within the circuit formation region in a plane,
a second trench portion is formed in the first insulator so as to surround the circuit formation region in a plane,
a second wire is formed by filling the electric conductive film in the second trench portion, and
the first region is arranged outside the second wire in a plane.

16. The semiconductor device according to claim 9, further comprising:
a third wire formed by filling the electric conductive film in a third trench portion formed in the third insulator, wherein
a plurality of wiring layers are formed on the main surface of the semiconductor substrate,
the plurality of the wiring layers are formed by stacking the third insulator, the third wire, and the second insulator, and
at least the second insulator in the lowermost layer among the plurality of layers of the second insulators is removed in the first region.

* * * * *